United States Patent
Yamamoto et al.

(10) Patent No.: US 8,217,274 B2
(45) Date of Patent: Jul. 10, 2012

(54) WIRING MEMBER, METHOD OF MANUFACTURING THE WIRING MEMBER AND ELECTRONIC ELEMENT

(75) Inventors: Hiroki Yamamoto, Hitachi (JP); Takashi Naito, Funabashi (JP); Takuya Aoyagi, Hitachi (JP); Yuuichi Sawai, Anan (JP); Takahiko Kato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 268 days.

(21) Appl. No.: 12/793,335

(22) Filed: Jun. 3, 2010

(65) Prior Publication Data

US 2010/0307802 A1   Dec. 9, 2010

(30) Foreign Application Priority Data

Jun. 4, 2009   (JP) ................. 2009-134610

(51) Int. Cl.
*H05K 1/09* (2006.01)

(52) U.S. Cl. ........ 174/257; 174/256; 361/767; 361/808; 29/839

(58) Field of Classification Search .............. 174/256, 174/257, 260, 261; 361/760, 767, 807, 808; 29/831, 839, 842, 843
See application file for complete search history.

(56) References Cited

U.S. PATENT DOCUMENTS

| 5,164,332 | A   | * | 11/1992 | Kumar ............................ 438/653 |
| 5,436,410 | A   | * | 7/1995  | Jain et al. ....................... 174/256 |
| 6,271,591 | B1  | * | 8/2001  | Dubin et al. .................... 257/751 |
| 2008/0012134 | A1 | * | 1/2008 | Choi et al. ...................... 257/751 |
| 2008/0048320 | A1 | * | 2/2008 | Lee et al. ........................ 257/737 |

FOREIGN PATENT DOCUMENTS

| JP | 62-290150 A    | 12/1987 |
| JP | 5-102155 A     | 4/1993  |
| JP | 2007-188982 A  | 7/2007  |

* cited by examiner

*Primary Examiner* — Hoa C Nguyen
(74) *Attorney, Agent, or Firm* — Crowell & Moring LLP

(57) ABSTRACT

A wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, and an aluminum oxide layer contiguous to and covering the aluminum diffusion layer, wherein a ratio of a thickness of the copper wiring layer to a thickness of the aluminum diffusion layer is 1.5 to 5. The disclosure is also concerned with a method of manufacturing the wiring member and an electronic device.

18 Claims, 6 Drawing Sheets

WIRING MEMBER, METHOD OF MANUFACTURING THE WIRING MEMBER AND ELECTRONIC ELEMENT

CLAIM OF PRIORITY

The present application claims priority from Japanese Patent Application Serial No. JP 2009-134610, filed on Jun. 4, 2009, the content of which is hereby incorporated by reference into this application.

FIELD OF THE INVENTION

The present invention relates to a wiring member with low resistance, low cost and high resistance to calcining oxidation in an oxidizing atmosphere at high temperatures, a method for manufacturing the wiring member and electronic devices using the wiring member.

BACKGROUND OF THE INVENTION

As wiring materials for electronic devices such as flat display panels including plasma displays, liquid crystal displays, semiconductor elements including LSI and solar cell panels, silver and copper metal wiring materials have been used. When heat treatment at a high temperature such as 600 to 700° C. is required during manufacturing devices such as plasma display panels, liquid crystal displays and solar cell panels of the above electronic devices, silver wiring materials have been used because the materials are not oxidized in the high temperature heat treatment and keep high electrical conductivity.

In recent years, cyclic utilization of global resources have been demanded to lead a movement for suppressing use of the noble metal materials. In order to realize a low cost of electronic devices, use of copper, which is plenty of resource, has been studied. However, since highly pure copper easily tends to be oxidized to have high electric resistance when oxygen enters the high temperature heat treatment process, a function for wiring material will be lost. There have been reported technologies for improving resistance to oxidation of the copper material by adding a secondary element such as aluminum, titanium, gold, silver, nickel, molybdenum, etc to copper.

As disclosed in patent document Nos. 1, 2 and 3, there are proposed structures wherein copper wires are covered with copper film containing aluminum in order to suppress oxidation of copper wiring of electronic circuits such as LSI during a heat treatment at around 400° C.

However, if these elements are added to copper, points where additive elements are present become centers of scattering of electrons so that electrical resistivity increases. Accordingly, high oxidizing resistance and low electrical resistivity are not contradict to each other and hard to coexist.

Even if the copper wires are covered with materials containing materials with resistance to oxidation, it was impossible to suppress oxidation at the time of heat treatment at high temperatures such as 600 to 700° C. when a thickness or a composition thereof is insufficient, Patent document 1: Japanese Patent Laid-open S62-290150

Patent document 1: Japanese Patent Laid-open H05-102155

Patent document 1: Japanese Patent Laid-open 2007-188982

SUMMARY OF THE INVENTION

It is an object of the present invention to provide a wiring member with high oxidizing resistance and low electrical resistivity at such high temperatures as 600 to 700° C. and is capable of forming it at a low cost, a method of manufacturing it and electrical devices using the same.

In order to attain the object, the present invention provides a wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, and an aluminum oxide layer contiguous to and covering the aluminum diffusion layer, wherein a ratio of a thickness of the copper wiring layer to a thickness of the aluminum diffusion layer is 1.5 to 5. Preferably, the ratio should be 2 to 3.

The present invention also provides a wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, an aluminum-copper alloy layer contiguous to the aluminum diffusion layer, and an aluminum oxide layer, contiguous to the aluminum-copper alloy layer, covering the aluminum diffusion layer, wherein a ratio of a thickness of the copper wiring to a thickness of the aluminum diffusion layer is 1.5 to 5.

Further, the present invention provides a wiring member comprising a substrate; a wiring comprising a copper wiring layer having an electrical resistivity of not larger than $4 \times 10^{-6}$ $\Omega$cm, aluminum diffusion layers, contiguous to each side of the copper wiring layer, each of the aluminum diffusion layers having an aluminum concentration gradient descending towards the inside, aluminum-copper alloy layers contiguous to the aluminum diffusion layers, aluminum oxide layers each covering each of the aluminum diffusion layers; and a dielectric layer in which the wiring is buried, wherein a ratio of a thickness of the copper wiring to a thickness of the aluminum diffusion layers is 1.5 to 5.

Still further, the present invention provides a method of manufacturing a wiring member comprising:

forming a copper layer having an electrical resistivity of not larger than $4 \times 10^{-6}$ $\Omega$cm in directly or indirectly contact with a substrate;

forming an anti-oxidation layer selected from aluminum or aluminum-copper alloy layer having a thickness of 50 to 200 nm on the copper wiring layer, wherein the aluminum-copper alloy contains 50% by weight or more of aluminum;

patterning the wiring layer and the anti-oxidation layer; and heating the wiring layer and the anti-oxidation layer to cause aluminum in the anti-oxidation layer to be diffused into the copper wiring layer and oxidize aluminum so as to obtain a ratio of a thickness of the copper wiring layer to a thickness of the aluminum diffusion layer being 1.5 to 5.

The present invention provides an electronic device, which comprises:

a wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, and an aluminum oxide layer contiguous to and covering the aluminum diffusion layer, wherein a ratio of a thickness of the copper wiring layer to a thickness of the aluminum diffusion layer is 1.5 to 5; and an electronic element, which is electrically connected to the wiring member.

In the present invention, heating of the wiring and the layer in an oxidizing atmosphere is performed at a temperature of 600 to 700° C. The wiring and or the aluminum or the aluminum alloy layer is formed by sputtering method, aerosol; deposition method, screen printing method or plating method.

An electronic device according to the present invention comprises a wiring member which comprises a substrate, a copper wiring directly or via another layer on the substrate, and a layer of aluminum or aluminum alloy containing copper in an amount of 50 wt % or less, and an electronic component electrically connected to the wiring member, wherein the electronic component is a plasma display panel, a liquid crystal display, solar cell panel, etc.

According to embodiments of the present invention, because it is possible to obtain a wiring member having high resistance to calcining oxidation at high temperatures in an oxidizing atmosphere and having low electrical resistivity, it is unnecessary to adopt such high-cost processes for treatment of electronic devices as in reducing atmosphere or vacuum atmosphere. Further, since expensive rare metals such as silver are not used, material cost is low and steady supply of materials can be possible.

In the present invention, the electrical resistivity of the copper wiring layer and the aluminum diffusion layer or of the copper wiring layer, the aluminum diffusion layer and the aluminum-copper alloy layer is the sum of the electrical resistivity of the layers or appearance electrical resistivity.

Figure 1:
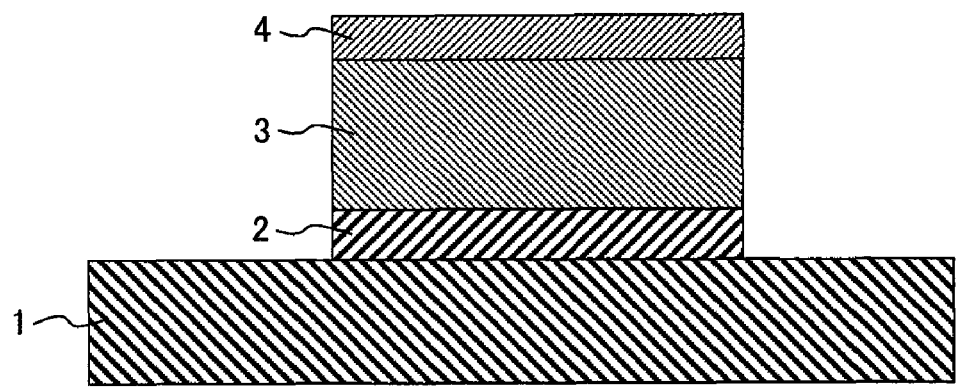
FIG. 1 shows a cross sectional view of a wiring member of an embodiment of the present invention.

Reference numerals used in the drawings are as follows.

1: Substrate, 2: Under layer, 3: Copper wiring, 4: CuAl alloy film, 5: Oxidized layer of CuAl alloy film, 6: Oxidized layer of copper wiring layer, 7: Al diffusion layer into the copper wiring layer, 10: Front panel, 11: Back panel, 12: Partition wall, 13: Sealing material, 15, 16, 17: Fluorescent substances of red, green and blue, 18: Display electrode, 19: Address electrode, 20: Ultra violet ray, 21, 22: Dielectric layer, 23: Protecting layer, 24: Cr film, 25: Cu wiring film, 26: CuAl alloy film

DETAILED DESCRIPTION OF THE EMBODIMENTS

After a thin film of Cr with about 10 nm thick, which is intimacy with a glass substrate, was formed on the glass substrate of about 30 mm square, copper film with 3 μm was formed on the Cr film. A 50 wt % Cu-50 wt % Al film with 120 nm thick was formed on the copper film. The both films wee formed by DC magnetron sputtering method. Thereafter, photoresist was formed on the Cu—Al thin film to form a masking with a line width of 100 μm. Then, the masked films were subjected to pattern exposure with ultra-violet ray, and were subjected to chemical etching in a nitric solution. As a result, the copper wiring layer with a line width of 100 μm and a wiring height (thickness of wiring) of 3 μm was obtained. The resulted wiring was subjected to heating in air at 600° C. for one hour to oxidize the wiring.

The resulting wiring did not change its outer appearance between before-heat treatment and after-heat treatment. Oxidation was not observed with eyes. Resistance of the wiring was measured to find that the resistance before the heat treatment was $1.9 \times 10^{-6}$ Ωcm and the resistance after heat-treatment was $3.7 \times 10^{-6}$ Ωcm. The resistance after the heat-treatment increased a little, but it was sufficiently low enough to be utilized as wiring.

Though the above result was obtained by calcination in air, the same oxidation resistance was obtained when a material such as dielectric glass is coated on the Cu—Al film of the wiring.

In the following, embodiments will be explained in detail.

Embodiment 1

FIG. 1 shows a cross sectional view of the wiring member of the embodiment of the present invention.

In FIG. 1, the wiring member comprises a substrate 1, an under layer 2, a copper wiring layer 3 and a CuAl alloy thin film 4. In this embodiment, alumino-silicate group glass with a high stain point was used as the substrate. In this embodiment, the size of the substrate was 30 mm square.

The under layer 2 (first layer) of Cr with 10 nm was formed on the surface of the substrate. Then, the copper wiring layer 3 (second layer) with 3 μm was formed on the first layer, followed by forming the 50 wt % Cu-50 wt % Al film 4 (third layer) with 30 to 120 nm thick. The films 2 to 4 were prepared by DC magnetron sputtering method. As targets for Cr and Cu, single layer targets of Cr and Cu (a diameter: 152.4 mm) were used. Purity of the targets was 99.9% or higher. Film forming atmospheric gas was pure argon gas with purity of 99.9999%, and a pressure for film forming was 0.7 Pa. A reached vacuum pressure was $4 \times 10^{-5}$ Pa or less. A power for film forming was 500 W for each of the targets.

After forming the films, a photo-resist was coated on the film 4 to irradiate the photo-resist with ultra violet ray via a mask for forming a line width of 100 nm. Thereafter, the resist was removed except for the wiring portions with a removing solution to develop the films, and then the exposed films were removed with nitric acid solution. As a result, copper wiring layer with the line width of 100 nm, a line height of 3 nm and a line length of 30 mm was obtained. In this embodiments, a thickness of the 50 wt % Cu-50 wt % Al film were 30, 60 and 120 nm.

For comparison, a wiring having no 50 Cu-50 Al film and a wiring with 98 wt % Cr-2 wt % Al film instead of the Cu film 3 of 3 μm were prepared. The resulting comparative wirings were subjected to heat treatment in air at 400° C., 600° C. and 700° C. for one hour for evaluation.

Figure 2:
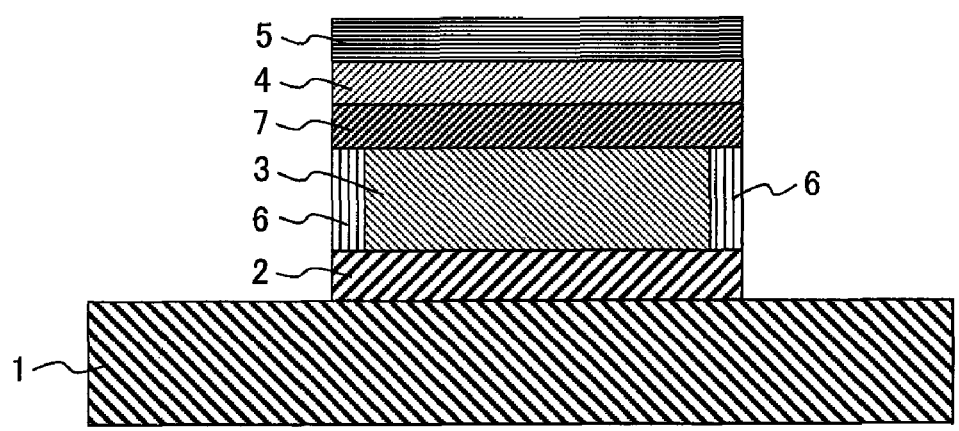
FIG. 2 is a cross sectional view of a wiring member of another embodiment of the present invention.

FIG. 2 shows a cross sectional view of the wiring after heat treatment.

In FIG. 2, the wiring comprises an oxidized layer 5 of the CuAl film 4, an oxidized layer 6 of copper wiring layer, and an aluminum diffusion layer 7. When the sample after heat treatment at 600° C. for one hour was observed with a scanning type electron microscope, the oxidized layer of copper and aluminum with a thickness of 5 nm to 10 nm was formed on the surface of the CuAl film after the heat treatment. Aluminum in the CuAl film diffused into copper film 3 to form the aluminum diffusion layer 7. A thickness of the diffusion layer from the surface of the copper film was about 100 nm. In this diffusion layer, a concentration of aluminum in a region nearest to the CuAl film was highest. Further, since the side surface of the copper film 3 was oxidized to form an oxidized layer 6 with about 300 nm thick.

oxidation layer. In this case, the aluminum layer may be disappear when the wiring is subjected to heat treatment at 600 to 700° C. for 10 seconds to 30 minutes in oxidizing atmosphere. As a result, the wiring member has a structure consisting of an aluminum oxidized layer 5, the aluminum diffusion layer 7 having a thickness $t_1$, a copper layer 3' having a thickness $T_2$, an under layer or a bonding layer, which is intimate with the substrate such as glass. A ratio of $T_2$ to $t_1$ should be 1.5 to 5, preferably 2 to 3 so that the appearance electrical resistivity of the wiring consisting of the aluminum diffusion layer and copper layer should be not larger than $4 \times 10^{-6}$ Ωcm.

Figure 7A:
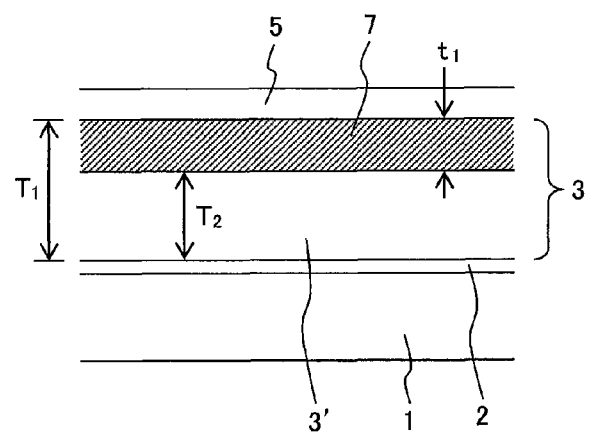
FIG. 7A is a sectional view of the wiring member of an embodiment.
Figure 7B:
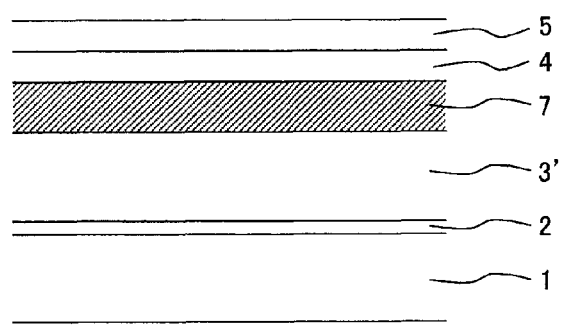
FIG. 7B is a sectional view of the wiring member of another embodiment.

In the case where the aluminum-copper alloy containing aluminum of 50% by weight is used as the anti-oxidation layer, the resulting structure may be shown in FIG. 7B, wherein an aluminum-copper layer 4 main remain, while the thickness of the layer decreases due to aluminum diffusion. The ratio of the thickness of the copper layer 3' to the aluminum diffusion layer 7 is the same as mentioned above.

The surface state of the oxidized layer was observed with an optical microscope. Electrical resistivity was measured by a four terminals method to evaluate electrical resistivity of the wiring member. For comparison, the electrical resistivity after heat treatment in vacuum (vacuum degree: about $1 \times 10^{-4}$ Pa) at 500° C. was evaluated.

In Table 1, there are shown the evaluation results.

TABLE 1

| | | Samples | | | | Heat treatment | | | | | |
|---|---|---|---|---|---|---|---|---|---|---|---|
| | | $1^{st}$ | $2^{nd}$ | $3^{rd}$ | | Not treated | 400° C. | 500° C. | 600° C. | 700° C. | 800° C. |
| | Substrate | layer | layer | layer | | — | air | air | air | air | vacuum |
| Com. Em. 1 | Glass | Cr 10 nm | Cu 3 μm | — | Appearance | ○ | X | X | X | X | ○ |
| | | | | | Electrical resistivity (Ω · cm) | $1.91 \times 10^{-6}$ | $2.1 \times 10^4$ | $3.5 \times 10^4$ | $1.2 \times 10^5$ | $2.41 \times 10^5$ | $1.88 \times 10^{-6}$ |
| Com. Em. 2 | Glass | Cr 10 nm | 98Cu—2Al 3 μm | — | Appearance | ○ | ○ | X | X | X | ○ |
| | | | | | Electrical resistivity (Ω · cm) | $7.22 \times 10^{-6}$ | $1.26 \times 10^{-5}$ | $2.53 \times 10^4$ | $2.11 \times 10^5$ | $3.31 \times 10^5$ | $5.52 \times 10^{-6}$ |
| Em. 1 | Glass | Cr 10 nm | Cu 3 μm | 50Cu—50Al 30 μm | Appearance | ○ | ○ | ○ | X | X | ○ |
| | | | | | Electrical resistivity (Ω · cm) | $1.92 \times 10^{-6}$ | $2.09 \times 10^{-6}$ | $2.40 \times 10^{-6}$ | $3.21 \times 10^3$ | $7.02 \times 10^3$ | $2.23 \times 10^{-6}$ |
| Em. 2 | Glass | Cr 10 nm | Cu 3 μm | 50Cu—50Al 60 μm | Appearance | ○ | ○ | ○ | X | X | ○ |
| | | | | | Electrical resistivity (Ω · cm) | $1.88 \times 10^{-6}$ | $2.24 \times 10^{-6}$ | $3.48 \times 10^{-6}$ | $4.12 \times 10^3$ | $8.15 \times 10^3$ | $2.28 \times 10^{-6}$ |
| Em. 3 | Glass | Cr 10 nm | Cu 3 μm | 50Cu—50Al 120 μm | Appearance | ○ | ○ | ○ | ○ | ○ | ○ |
| | | | | | Electrical resistivity (Ω · cm) | $1.91 \times 10^{-6}$ | $2.43 \times 10^{-6}$ | $3.81 \times 10^{-6}$ | $3.77 \times 10^{-6}$ | $3.75 \times 10^{-6}$ | $3.95 \times 10^{-6}$ |

Figure 6:
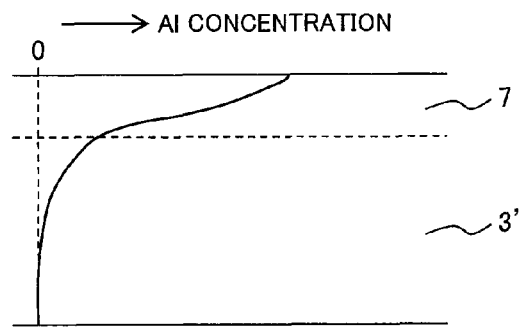
FIG. 6 shows a profile of aluminum concentration in an aluminum diffusion layer.

As shown in FIG. 6, the aluminum diffusion layer 7 has a concentration profile wherein the top face has the highest concentration and the aluminum concentration gradually decreases. The remaining copper layer 3' plus the aluminum diffusion layer 7 is the copper wiring layer.

According to the embodiments of the present invention, there may be two typical structures obtained by heat treating or calcination of the copper wiring layer. FIG. 7A shows one of them, wherein an aluminum layer is used as the anti- In Table 1, ○ represents that the wiring surface has metallic brightness and x represents that the wiring surface has portions where color changes color into black due to oxidation, when the surface is observed with eyes after heat treatment. The electrical resistivity was measured by measuring electrical resistance of the wiring with the four terminal probe method, and the resulting values were converted into electrical resistivity from the length of the wiring and a sectional area thereof.

As is shown in Table 1, in the samples in which the copper film of 3 μm, when no heat treatment is applied, the electrical resistivity of the wiring was $1.91 \times 10^{-6}$ Ωcm, which is close to $1.55 \times 10^{-6}$ Ωcm, i.e. a theoretical electrical resistivity of copper. Further, in case of heat treatment in vacuum, the electrical resistivity was as low as $1.88 \times 10^{-6}$ Ωcm. When the wiring is heated in air at 400 to 700° C., the surface thereof is oxidized into black color, and electrical resistivity became the order of $10^4$ to $10^3$ Ωcm. This wiring cannot be utilized as wiring material.

In case of comparative embodiment 2, in which 98 wt % Cu-2 wt % Al was used, the electrical resistivity was $7.22 \times 10^{-6}$ Ωcm, which is quite higher than that of pure copper. In the case where the wiring was heat treated at 400° C., the electrical resistivity was $1.26 \times 10^{-5}$ Ωcm, which is higher than the value before heat treatment, but the value became much smaller than that of pure copper. Wirings that were heat treated at temperatures higher than 500° C., the wiring was oxidized and the wiring was not suitable for wiring materials.

On the other hand, in case of samples using 50 wt % Cu-50 wt % of Al, which were not heat treated, the electrical resistivity was $1.9 \times 10^{-6}$ Ωcm or less, which was approximately the same as that of pure copper. In any samples, which were heat treated at 400° C. and 500° C., the surface of the wiring had metallic brightness and electrical resistivity was $4 \times 10^{-6}$ Ωcm or less, which is sufficiently low for wiring materials.

In case the wiring is heat treated in air at 600° C. and 700° C., the samples in which 50 Cu-50 Al films of 30 nm and 60 nm are formed (embodiments 1, 2), black dots, which represent oxidation appeared in the surface of the samples, the electrical resistivity was as high as the order of $10^3$ Ωcm. On the other hand, a 50 Cu-50 Al film of 120 nm thick exhibited metallic brightness even when the samples were heat treated in air at 600° C. and 700° C., and electrical resistivity was as low as $3.77 \times 10^{-6}$ Ωcm and $3.75 \times 10^{-6}$ Ωcm, respectively. These values are smaller than that heat treated in vacuum at 500° C.

From the above description, it has been proven that if a 50 Cu-50 Al film of 120 nm or so is formed of pure copper wiring layer, it could be possible to impart extremely high resistance to oxidation to the wiring.

Next, for the purpose of investigation of a relationship between a composition of the CuAl alloy and thickness of the films and change of electrical resistivity of films having different Al compositions and different thicknesses that are heat treated in air at 600° C. were investigated. The results are shown in Tables 2 and 3.

TABLE 2

| | Samples | | | | Thickness of 3rd layer (nm) | | | | | | |
|---|---|---|---|---|---|---|---|---|---|---|---|
| Substrate | 1st layer | 2nd layer | 3rd layer | | 10 | 20 | 50 | 70 | 100 | 120 | 200 |
| Com. Em. 3 | Glass | Cr 10 nm | Cu 3 μm | 98Cu—2Al Appearance Electrical resistivity (Ω·cm) | X $8.54 \times 10^4$ | X $8.26 \times 10^4$ | X $7.52 \times 10^4$ | X $6.12 \times 10^3$ | X $4.10 \times 10^5$ | X $2.21 \times 10^3$ | X $1.12 \times 10^3$ |
| Com. Em. 4 | Glass | Cr 10 nm | Cu 3 μm | 95Cu—5Al Appearance Electrical resistivity (Ω·cm) | X $7.31 \times 10^4$ | X $6.12 \times 10^4$ | X $5.07 \times 10^4$ | X $3.42 \times 10^3$ | X $1.12 \times 10^3$ | ○ $8.92 \times 10^2$ | ○ $1.25 \times 10^{-5}$ |
| Com. Em. 5 | Glass | Cr 10 nm | 98Cu—2Al 3 μm | 90Cu—10Al Appearance Electrical resistivity (Ω·cm) | X $5.12 \times 10^4$ | X $4.41 \times 10^4$ | X $3.48 \times 10^3$ | X $3.10 \times 10^3$ | ○ $1.85 \times 10^3$ | ○ $5.12 \times 10^{-6}$ | ○ $4.85 \times 10^{-6}$ |
| Com. Em. 6 | Glass | Cr 10 nm | Cu 3 μm | 70Cu—30Al Appearance Electrical resistivity (Ω·cm) | X $5.03 \times 10^4$ | X $5.10 \times 10^4$ | X $4.08 \times 10^3$ | X $3.28 \times 10^4$ | ○ $1.25 \times 10^{-6}$ | ○ $8.92 \times 10^{-6}$ | ○ $5.31 \times 10^{-6}$ |

TABLE 3

| | Samples | | | | Thickness of 3rd layer (nm) | | | | | | |
|---|---|---|---|---|---|---|---|---|---|---|---|
| Substrate | 1st layer | 2nd layer | 3rd layer | | 10 | 20 | 50 | 70 | 100 | 120 | 200 |
| Em. 4 | Glass | Cr 10 nm | Cu 3 μm | 50Cu—50Al Appearance Electrical resistivity (Ω·cm) | X $5.22 \times 10^4$ | X $3.48 \times 10^3$ | X $3.58 \times 10^3$ | ○ $3.95 \times 10^{-6}$ | ○X $3.80 \times 10^{-6}$ | ○X $3.77 \times 10^{-6}$ | ○ $2.84 \times 10^{-6}$ |
| Em. 5 | Glass | Cr 10 nm | Cu 3 μm | 30Cu—70Al Appearance Electrical resistivity (Ω·cm) | X $4.52 \times 10^4$ | X $2.55 \times 10^3$ | ○ $3.56 \times 10^{-6}$ | ○ $3.52 \times 10^{-6}$ | ○ $3.59 \times 10^{-6}$ | ○ $3.08 \times 10^{-6}$ | ○ $2.56 \times 10^{-6}$ |
| Em. 6 | Glass | Cr 10 nm | Cu 3 μm | Al Appearance Electrical resistivity (Ω·cm) | X $1.99 \times 10^3$ | ○ $2.58 \times 10^{-5}$ | ○ $3.85 \times 10^{-6}$ | ○ $3.78 \times 10^{-6}$ | ○ $3.46 \times 10^{-6}$ | ○ $3.15 \times 10^{-6}$ | ○ $2.78 \times 10^{-6}$ |

In case of comparative embodiment No. 3 in Table 2 where the thin film contained Al in an amount of 2 wt %, the film changed color into black due to oxidation by calcination at 600° C., and electrical resistivity was as high as $10^3$ Ωcm or more; thus this material was not suitable for wiring material. In case of comparative embodiment Nos. 4 to 6 where the thin films contained 5 to 30 wt % of Al, thin films changed color into black and electrical resistivity was high. These films were not suitable for wiring materials, either. When the films were thick, the electrical resistivity exceeded $4\times10^{-6}$ Ωcm, and these films were not suitable for wiring materials, though the surface of the films kept metallic brightness.

On the other hand, when the thin films containing 50 wt % of Al in embodiment No. 4 had 70 nm or more, its appearance kept metallic brightness and electrical resistivity was not larger than $4\times10^{-6}$ Ωcm; the film was suitable for wiring material. In case of embodiment Nos. 5 and 6 where Al or aluminum alloys containing 30 wt % or less of Cu, electrical resistivity of the films was not larger than $4\times10^{-6}$ Ωcm, when a thickness was 50 nm or more. These films were suitable for wiring material.

Figure 3:
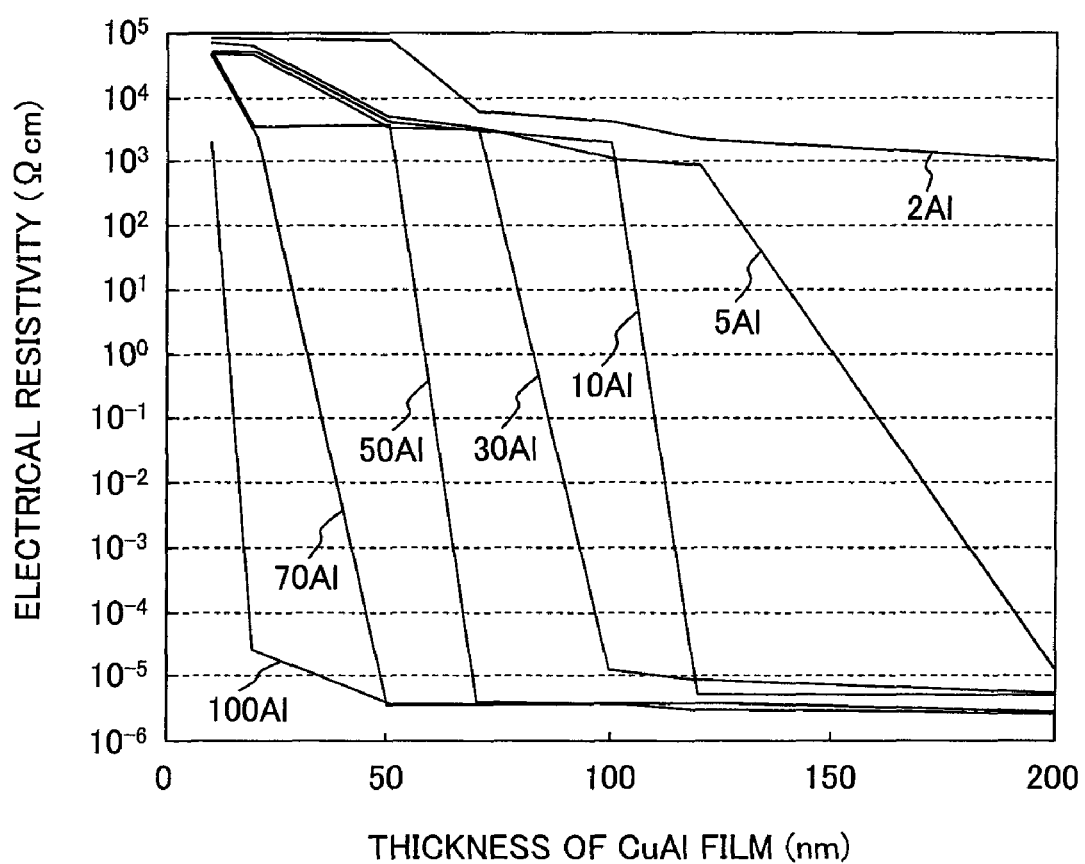
FIG. 3 shows a relationship between a thickness of a aluminum-copper alloy film and electrical resistivity of the aluminum-copper films having different aluminum concentrations.

The relationship between electrical resistivity and thickness shown in Table 2 is shown in FIG. 3. The data shown in FIG. 3 were obtained by heat treating them at 600° C. for one hour. It is desired that for high efficiency of plasma display panels and solar cells, the electrical resistivity of the wiring material should be not larger than $4\times10^{-6}$ Ωcm. Conditions for realizing the electrical resistivity has been investigated when the film material is subjected to heat treatment at 600° C.

From FIG. 3, it is apparent that when the concentration of Al is less than 50 wt %, there is not a range where the electrical resistivity of less than $4\times10^{-6}$ Ωcm, even when a thickness is large. This is because when the Al concentration is small, an oxidized layer is easily formed so that the oxidized layer increases the electrical resistivity of the wiring member.

When the Al concentration is not less than 50 wt %, there is a range where the electrical resistivity is not larger than $4\times10^{-6}$ Ωcm when the thickness is 50 to 200 nm. If the thickness is less than 50 nm, there is no range where the electrical resistivity is not larger than $4\times10^{-6}$ Ωcm, even if the Al concentration is high. This is because when the thickness is small, oxidation of copper is not suppress to form the oxidized layer.

Although oxidation is suppressed when the thickness is large, the electrical resistivity of the wiring increases as the thickness increases, because the electrical resistivity of CuAl layer may give an influence on the electrical resistivity of the wiring member.

From the above investigations, it should be preferable that the wiring member of the present invention is an aluminum alloy film containing copper in an amount of 50 wt % or less or aluminum in a thickness of 50 to 200 nm.

In the above mentioned embodiments, the films were prepared by sputtering method, but the films can be prepared by other methods such as aerosol deposition method, screen printing method, plating method, etc. The methods can be combined. For example, forming of copper film is done by one of the above methods, and the CuAl film may be formed by another one of the above mentioned methods.

Although in the above embodiments the under layer of Cr was formed between the glass substrate and the copper film in order to increase adhesion, this under layer can be omitted in accordance with applications. For the purpose of increasing the adhesion between the substrate and the copper film, films of titanium, aluminum, molybdenum or tungsten achieved the same results.

Embodiment 2

Next, a plasma display panel manufactured by the process of the present invention will be explained in the following.

Figure 4:
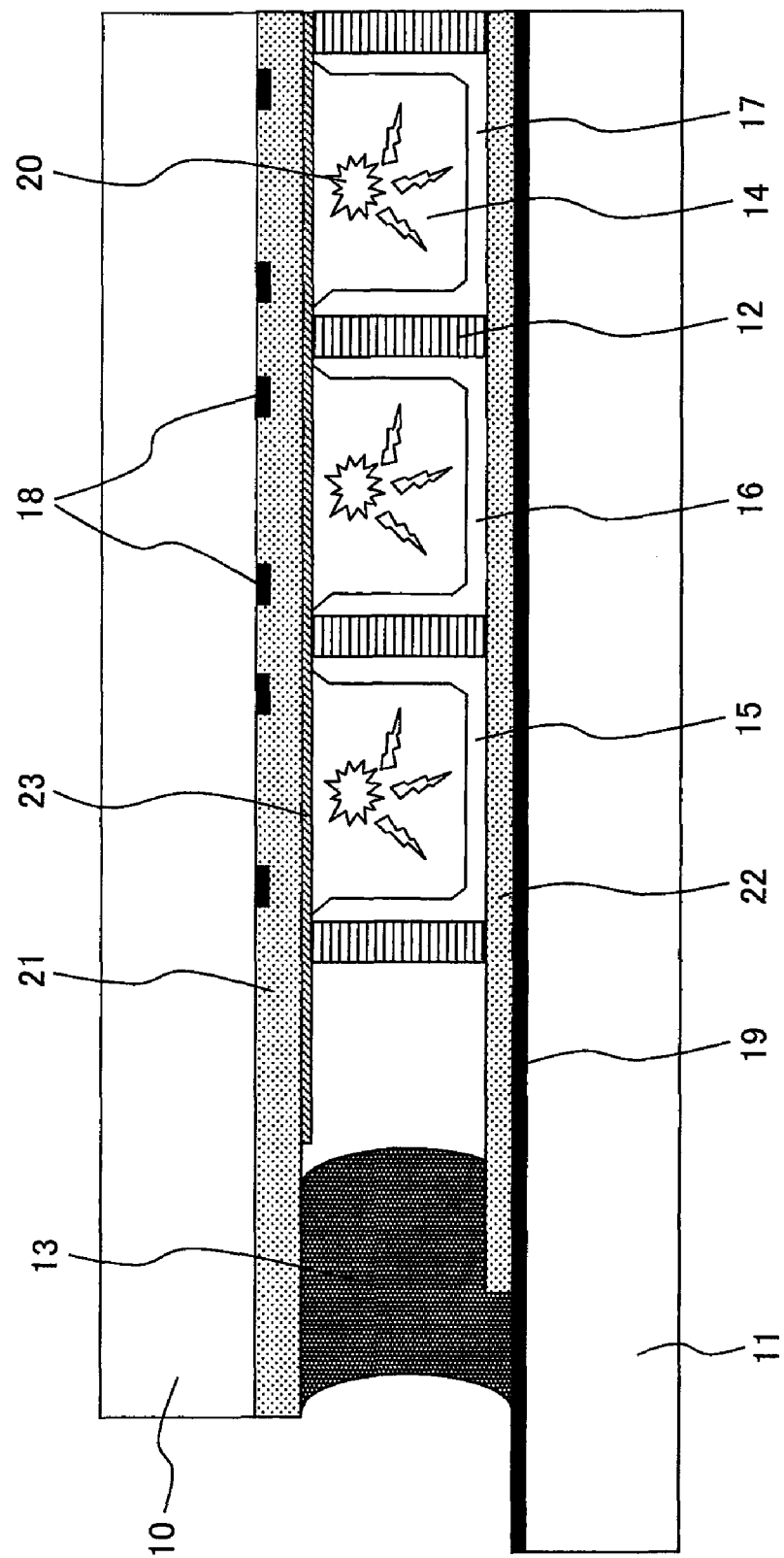
FIG. 4 is a cross sectional view of a plasma display panel to which the present invention is applied.

A cross sectional view of the plasma display panel is shown in FIG. 4.

In the plasma display panel of this embodiment, a front panel 10 and a back panel 11 are opposed to each other with a gap of 100 to 150 µm, and the gap between the panels is kept with partition walls 12. Peripheries of the front panel and back panel are air-tightly sealed with a sealant 13. Rare gas is filled in the inside of the plates. Fluorescent materials 15, 16, 17 are filled in small spaces (cells 14) defined by the partition walls 12. Three fluorescent colors of red 15, green 16 and blue 17 filled in the spaces constitute one pixel, Each pixel emits color light in response to specified signals.

The front panel 10 and the back panel 11 are provided with electrodes 18, 19 regularly arranged on the glass substrate 21. The display electrodes 18 on the front panel 10 and address electrodes 19 on the back panel 11 constitute pairs between which potentials of 100 to 200 V are applied selectively thereby emitting ultraviolet ray 20 to cause the fluorescent materials 15, 16, 17 to illuminate for displaying images. The display electrodes 18 and address electrodes 19 are covered with dielectric layers 21, 22 to protect them and to control charges on the partition walls at the discharge time. As the dielectric layers, glass thick films are used.

The partition walls 12 are disposed on the dielectric layer 22 on the address electrodes 19 formed on the back panel 11 to thereby form cells 14. The form of the partition walls 12 may be stripe or box forms.

As the display electrodes 18 and the address electrodes 19, silver thick films have been widely used. As is described above, change of silver thick films into copper thick films is preferable for preventing migration and cost reduction, but it should be realized that the electrical resistivity of the copper wiring layer does not increase when it is formed and heated in an oxidizing atmosphere, the electrical resistivity of the wiring does not increase by reaction between copper and dielectric layer material at the time of heat treatment, and a withstanding voltage of the wiring does not decrease by bubbles formed in the vicinity of the copper thick film.

Formation of the display electrodes 18 and the address electrodes 19 can be made by sputtering method, but printing method is suitable for reducing production cost.

The dielectric layers 21, 22 are formed by printing method, in general. The display electrodes 18, the address electrodes 19 and the dielectric layers prepared by the printing method are generally heat treated in oxidizing atmosphere at 450 to 620° C.

After the display electrodes 18 are formed so as to intersect the address electrodes 19 on the back panel 11, the dielectric layer 21 is formed over the entire of the dielectric layer 21. The dielectric layer 21 is covered with a protective layer 23 so as to protect the dielectric layer 21, etc from discharging. As a material for the protective layer 23, evaporated film of MgO is widely used.

On the other hand, after the address electrodes 19 are formed on the back panel 11, a dielectric layer 22 is formed in an area where cells are formed. The partition walls 12 are formed on the dielectric layer 22. The partition walls 12 made of lass material contains at lest glass composition and filler, which is calcined.

The partition walls 12 are formed in such a manner that a evaporating sheet having grooves at points where the partition walls are formed is adhered to the dielectric layer 22, wherein a paste for the partition walls is filled in the grooves, and the paste is calcined at about 600° C. so as to evaporate the sheet, followed by forming the partition walls.

The partition walls 12 can be prepared by coating the paste for the partition walls over the entire face of the dielectric layer 22, and after drying the coating, unnecessary portions of the coating are removed by sandblasting or chemical etching, followed by calcination at 500 to 600° C. to form the partition walls.

The cells 14 partitioned with the partition walls 12 are filled with pastes of fluorescent materials 15, 16, 17 for desired colors, then the pastes are calcined at 450 to 500° C. to form fluorescent substances 15, 16, 17.

In general, the front panel 10 and the back panel 11 are separately prepared, and they are opposed to each other by accurate positioning. The peripheries thereof are air-tightly sealed with glass at 420 to 500° C. The sealing material 13 is applied to at least one periphery of the panels by dispenser method or printing method. The sealing material 13 is applied on the back panel 11, in general. The sealing material 13 may be pre-calcined beforehand simultaneously with the fluorescent substances 15, 16, 17. By employing this technique, bubbles in the sealing portions can be remarkably suppressed to thereby provide a sealed portion with high air-tightness and high reliability.

After the glass sealing, cells 14 are evacuated to remove gas therein and rare gas is filled therein thereby co complete the display panel. In pre-calcination of the sealing material 13 or glass sealing, the sealing material 13 may directly contact the display electrodes 10 or the address electrodes 11. Reaction between the sealing material 13 and the electrode materials, which may increase the electrical resistivity of the electrode materials, should be avoided.

In turning on the display panel, the potential is applied at the points where the display electrodes and the address electrodes intersect to cause the rare gas in the cells to discharge to generate plasma. When the rare gas in the cells returns from the plasma state to the normal state, the gas emits ultraviolet ray, which is utilized to illuminate the fluorescent substances 15, 16, 17 to thereby turn on the display panel to display images. In turning on each of the colors, address discharge is performed between the display electrodes and the address electrodes to be turned on thereby to accumulate charges in the cells. When a certain potential is applied between the display-address electrode pairs, address discharge takes place to display discharge only in the cells where wall charges are accumulated to emit ultraviolet ray 20. The ultra violet ray 20 illuminates the fluorescent substances 15, 16, 17 to display the images.

In this embodiment, the effectiveness of the CuAl alloy film formed on Cu wiring for the address electrode was investigated. As the copper wiring layer, a wiring material comprising 85 volume % of copper powder having an average particle size of 1 to 2 μm and 15 volume % of glass powder having an average particle size of 1 μm was prepared, and a mixture comprising 85 volume % of 50 wt % Cu-50 wt % Al powder having an average particle size of 1 to 2 μm and 15 volume % of glass powder having an average particle size of 1 μm was prepared on the above copper wiring material. The composite wiring materials were applied to the display electrodes 18 on the front panel 10 and the address electrodes 19 on the back panel 11 to prepare the plasma display panel shown in FIG. 4.

Each of the above wiring materials was mixed with ethyl cellulose as a binder and butyl carbitol acetate as a solvent to prepare pastes for wiring. The pastes were coated on the front panel 10 and the back panel 11 by screen printing method. Thereafter, the coatings were calcined in air at 530° C. for 30 minutes to obtain the display electrodes 18 and the address electrodes 19. Then, glass was coated on the electrodes to form the dielectric layers 21, 22. The glass for the dielectric layers was lead-free glass powder having an average particle size of 1 μm and having a softening point of around 560° C., and the glass powder was mixed with the binder ethyl cellulose and the solvent butyl carbitol acetate to prepare a paste.

A sealing glass paste was prepared using the same lead-free glass, the binder and the solvent as mentioned above. The front panel 10 and the back panel 11 were prepared separately and assembled. The peripheries thereof were glass sealed to produce a display panel. The display electrodes 18 and the address electrodes 19 according to the embodiment did not change color due to oxidation and the wiring could be mounted on the display panel without voids at the interface of the display electrodes 18 and the dielectric layer 21 and at the interface of the address electrodes 19 and the dielectric layer 22.

Next, turning on tests of the plasma display panel was conducted. The display electrodes 18 and the address electrodes 19 did not increase electrical resistivity, and did not decrease withstanding voltage. Migration of metal atoms was not observed. Any other problems were not observed.

The wiring material of the present invention can be applied not only to plasma display panels, but to the wiring material for solar cells. Although wiring materials comprising silver powder and glass powder have been used for the solar cells, it is possible to reduce a cost of the wiring material for the solar cells by employing the wiring material according to the present invention.

Embodiment 3

Figure 5A:
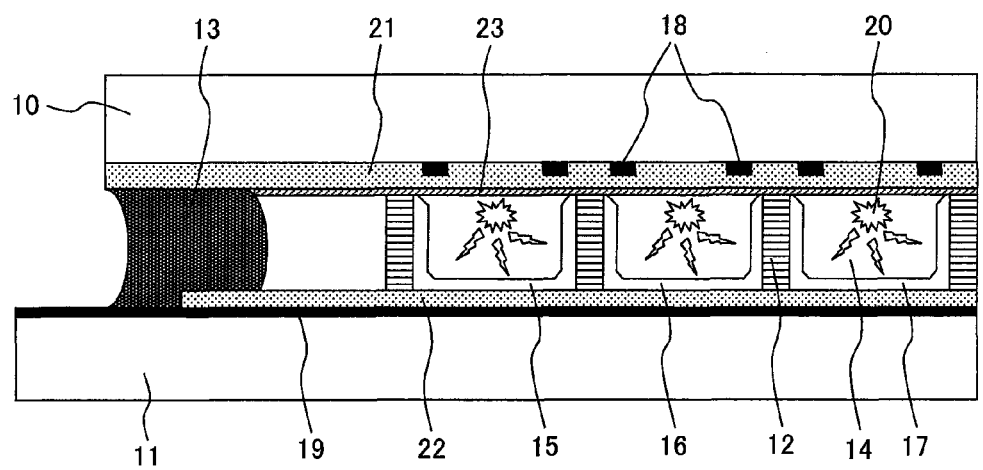
FIG. 5A is a cross sectional view of a plasma display panel according to another embodiment of the present invention.
Figure 5B:
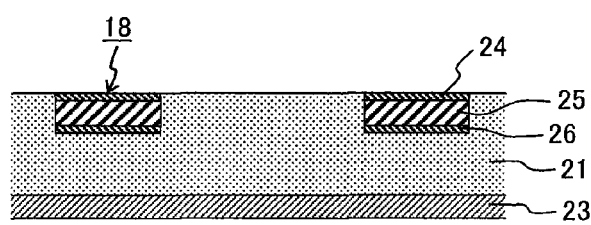
FIG. 5B is an enlarged cross sectional view of a portion around the display electrodes 18 shown in FIG. 5A.
Figure 5C:
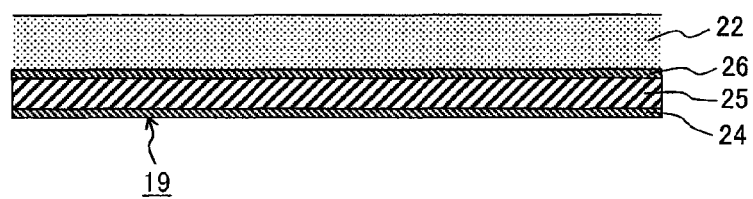
FIG. 5C is an enlarged cross sectional view of a portion around the address electrodes 19 shown in FIG. 5A.

The plasma display panel shown in FIGS. 5A-5C was prepared wherein the display electrodes 18 and the address electrodes 19 were prepared by sputtering method. As the wiring material, the copper film 25 and the 50 Cu-50 Al film 26 were formed on a Cr film 24 to form a three layer structure. Thicknesses of the films were 0.2 μm for the Cr film, 3.0 μm for the copper film and 0.1 μm for the CuAl film. A plasma display panel was prepared in the similar manner as in embodiment 2. Sputter targets were a metal Cr disc, a copper disc and a CuAl alloy disc.

The display electrodes 18 and the address electrodes 19 could be mounted plasma display panel without any voids at the side faces of the display electrodes 18 and the address electrodes 19.

This display panel was subjected to tests for turning-on. The electrical resistivity of the display electrodes 18 and the address electrodes 19 did not increase, and a withstanding voltage did not decrease. Migration was not observed. There were any other problems were present.

For comparison, a plasma display panel was prepared in the same manner as in the embodiment, wherein the CuAl film 26 was not formed to prepare the display electrodes 18 and the address electrodes 19. Voids were observed at the side faces of the display electrodes 18 and the address electrodes 19, and the withstanding voltage decreased to half.

As has been described, the display electrodes 18 comprising the under layer of Cr and the third film of CuAl film can suppress reaction between the dielectric layer and the wiring so as to prevent generation of the voids. Similarly, the under layer can be substituted with chromium oxide film to achieve the same result, i.e. good adhesion between the CuAl film and the back panel. It is possible to control a hue of the display electrodes viewed from the front by interference between reflected light from the CuAl film and reflected light from the Cr oxide film, wherein a thickness of the Cr film is adjusted so that black color to dark color or brown color can be obtained.

In the above embodiments, plasma display panels have been described, but the wiring according to the embodiments bring about advantages as long as electronic devices use copper wiring layer with excellent oxidation resistance. For example, the present invention may be applied to processes for manufacturing solar cells, semiconductor devices or liquid crystal displays that employ heat treatment at 600° C. or higher.

Figure 8:
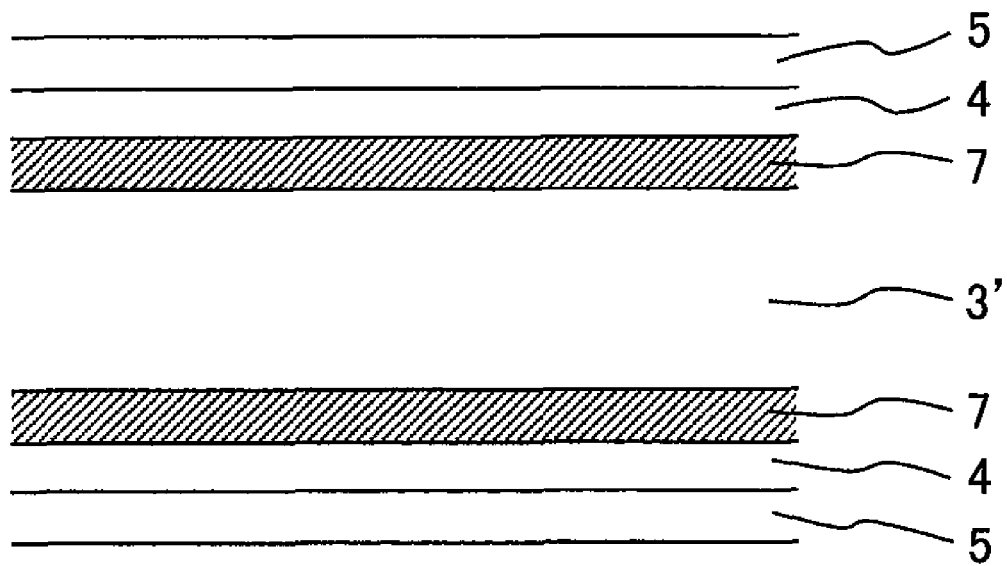
FIG. 8 is a sectional view of a wiring member of still another embodiment.

In this embodiment, a sectional view of the wiring member may be shown in FIG. 8, wherein the copper layer 3' is sandwiched between aluminum diffusion layers 7, aluminum-copper alloy layers 4 and oxide layers 5. The ratio of the thickness of the copper layer to the thickness of the aluminum diffusion layer should be the same as mentioned before.

What is claimed is:

1. A wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, and an aluminum oxide layer contiguous to and covering the aluminum diffusion layer, wherein a ratio of a thickness of the copper wiring layer to a thickness of the aluminum diffusion layer is 1.5 to 5.

2. The wiring member according to claim 1, which further comprises a bonding layer between the substrate and the copper wiring.

3. The wiring member according to claim 1, wherein an appearance electrical resistivity of the aluminum diffusion layer and the copper wiring layer is not larger than $4 \times 10^{-6}$ $\Omega$cm.

4. The wiring member according to claim 1, wherein the bonding layer is made of a member selected from the group consisting of chromium, titanium, aluminum, molybdenum, tungsten and combinations thereof.

5. A wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, an aluminum-copper alloy layer contiguous to the aluminum diffusion layer, and an aluminum oxide layer, contiguous to the aluminum-copper alloy layer, covering the aluminum diffusion layer, wherein a ratio of a thickness of the copper wiring to a thickness of the aluminum diffusion layer is 1.5 to 5.

6. The wiring member according to claim 5, which further comprises a bonding layer between the substrate and the copper wiring.

7. The wiring member according to claim 5, wherein an appearance electrical resistivity of the aluminum diffusion layer and the copper wiring layer is not larger than $4 \times 10^{-6}$ $\Omega$cm.

8. The wiring member according to claim 5, wherein the bonding layer is made of a member selected from the group consisting of chromium, titanium, aluminum, molybdenum, tungsten and combinations thereof.

9. A wiring member comprising a substrate; a wiring comprising a copper wiring layer having an electrical resistivity of not larger than $4 \times 10^{-6}$ $\Omega$cm, aluminum diffusion layers, contiguous to each side of the copper wiring layer, each of the aluminum diffusion layers having an aluminum concentration gradient descending towards the inside, aluminum-copper alloy layers contiguous to the aluminum diffusion layers, aluminum oxide layers each covering each of the aluminum diffusion layers; and a dielectric layer in which the wiring is buried, wherein a ratio of a thickness of the copper wiring to a thickness of the aluminum diffusion layers is 1.5 to 5.

10. The wiring member according to claim 9, which further comprises a bonding layer formed between the substrate and the wiring.

11. The wiring member according to claim 9, wherein an appearance electrical resistivity of the wiring is not larger than $4 \times 10^{-6}$ $\Omega$cm.

12. The wiring member according to claim 9, wherein the bonding layer is made of a member selected from the group consisting of chromium, titanium, aluminum, molybdenum, tungsten and combinations thereof.

13. An electronic device, which comprises:
a wiring member comprising a substrate, a copper wiring layer having an electrical resistivity of not larger than $4 \times 10^{-6}$ $\Omega$cm in directly or indirectly contact with the substrate, an aluminum diffusion layer, contiguous to the copper wiring layer, having an aluminum concentration gradient descending towards the inside, and an aluminum oxide layer contiguous to and covering the aluminum diffusion layer, wherein a ratio of a thickness of the copper wiring layer to a thickness of the aluminum diffusion layer is 1.5 to 5; and
an electronic element, which is electrically connected to the wiring member.

14. The electronic device according to claim 13, wherein the electronic element is one member selected from the group consisting of a plasma display panel, a liquid crystal display panel, and a solar cell panel.

15. A method of manufacturing a wiring member comprising:
forming a copper layer having an electrical resistivity of not larger than $4 \times 10^{-6}$ $\Omega$cm in directly or indirectly contact with a substrate;
forming an anti-oxidation layer selected from aluminum or aluminum-copper alloy layer having a thickness of 50 to 200 nm on the copper wiring layer, wherein the aluminum-copper alloy contains 50% by weight or more of aluminum;
patterning the wiring layer and the anti-oxidation layer; and
heating the wiring layer and the anti-oxidation layer to cause aluminum in the anti-oxidation layer to be diffused into the copper wiring layer and oxidize aluminum so as to obtain a ratio of a thickness of the copper wiring layer to a thickness of the aluminum diffusion layer being 1.5 to 5.

16. The method according to claim 15, which further comprises a bonding layer between the substrate and the copper wiring.

17. The wiring member according to claim 15, wherein an appearance electrical resistivity of the aluminum diffusion layer and the copper wiring layer is not larger than $4 \times 10^{-6}$ $\Omega$cm.

18. The method according to claim 15, wherein the bonding layer is made of a member selected from the group consisting of chromium, titanium, aluminum, molybdenum, tungsten and combinations thereof.

* * * * *